United States Patent
Henneberger

(10) Patent No.: US 9,461,459 B2
(45) Date of Patent: Oct. 4, 2016

(54) SAFETY SYSTEM

(71) Applicant: SICK AG, Waldkirch/Breisgau (DE)

(72) Inventor: Stephan Henneberger, Freiburg (DE)

(73) Assignee: SICK AG, Waldkirch/Breisgau (DE)

( * ) Notice: Subject to any disclaimer, the term of this patent is extended or adjusted under 35 U.S.C. 154(b) by 417 days.

(21) Appl. No.: 14/048,419

(22) Filed: Oct. 8, 2013

(65) Prior Publication Data

US 2014/0168837 A1 Jun. 19, 2014

(30) Foreign Application Priority Data

Oct. 10, 2012 (EP) .................................. 12188000

(51) Int. Cl.
| | |
|---|---|
| H02H 3/10 | (2006.01) |
| H02H 3/18 | (2006.01) |
| G05B 9/02 | (2006.01) |
| G05B 23/02 | (2006.01) |
| G01R 31/02 | (2006.01) |

(52) U.S. Cl.
CPC .............. H02H 3/18 (2013.01); G05B 9/02 (2013.01); G05B 23/0256 (2013.01); H02H 3/10 (2013.01); G01R 31/025 (2013.01)

(58) Field of Classification Search
USPC .......................................... 361/84, 93.1, 87
See application file for complete search history.

(56) References Cited

U.S. PATENT DOCUMENTS

| | | | | |
|---|---|---|---|---|
| 4,124,778 A | * | 11/1978 | Amass | ................ H04L 7/06 341/70 |
| 4,543,565 A | * | 9/1985 | Oberstein | ............... G02B 26/00 340/506 |
| 4,630,233 A | | 12/1986 | Weppler | |
| 6,437,710 B1 | * | 8/2002 | Tam | ...................... H04L 25/493 341/58 |
| 2005/0130457 A1 | * | 6/2005 | Nozaki | ................ G11B 25/043 439/67 |
| 2006/0244619 A1 | | 11/2006 | Nickels | |

(Continued)

FOREIGN PATENT DOCUMENTS

| | | |
|---|---|---|
| DE | 10 2004 020 997 A1 | 11/2005 |
| DE | 10 2010 025 675 B3 | 11/2011 |

(Continued)

OTHER PUBLICATIONS

European Search Report sited in European Application No. 12 188 00.9 dated Mar. 21, 2013, in English and German languages.

(Continued)

*Primary Examiner* — Thienvu Tran
*Assistant Examiner* — Angela Brooks
(74) *Attorney, Agent, or Firm* — Nath, Goldberg & Meyer; Jerald L. Meyer

(57) ABSTRACT

The invention relates to a safety system comprising a safety unit having an output and a safety input, a bus line and at least one safety related participant. The bus line and the safety related participant form a test signal path having a forward path and a return path. The safety related participant comprises an interconnection module with a test signal input and a test signal output and a protective device integrated in the test signal path by means of the interconnection module. The protective device comprises two switches which are respectively connected to the interconnection module via a forward line and a return line of the interconnection line for the formation of a first and a second electric switching path. The interconnection module comprises a test circuit for the two switching paths with a controlled current source, a controlled current sink and a current direction element.

18 Claims, 5 Drawing Sheets

(56) References Cited

U.S. PATENT DOCUMENTS

Figure 1:
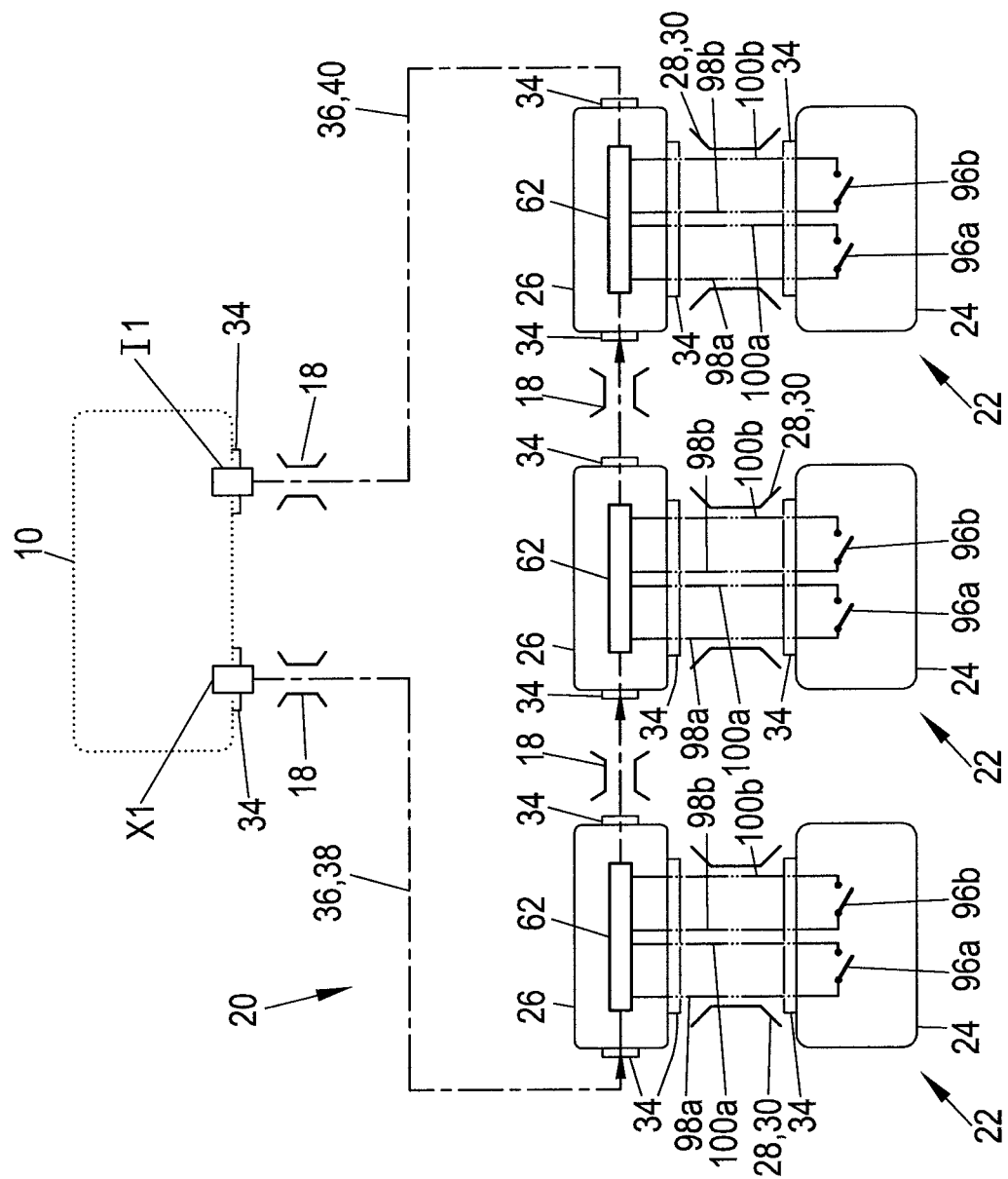

| | | |
|---|---|---|
| 2009/0265571 A1 | 10/2009 | Furukawa et al. |
| 2010/0049464 A1* | 2/2010 | Sleijpen .............. G01R 31/2886 702/120 |
| 2011/0112700 A1 | 5/2011 | Tajima |
| 2014/0097679 A1* | 4/2014 | Saumer ............. H04L 12/40045 307/18 |
| 2014/0100675 A1* | 4/2014 | Dold .................. G05B 19/0428 700/79 |
| 2014/0101486 A1* | 4/2014 | Henneberger .... H04L 12/40195 714/33 |
| 2014/0168837 A1* | 6/2014 | Henneberger ........... H02H 3/10 361/84 |

FOREIGN PATENT DOCUMENTS

| | | |
|---|---|---|
| DE | 10 2011 079 688 A1 | 4/2012 |
| DE | 20 2010 016 148 U1 | 4/2012 |
| DE | 10 2011 016 137 A1 | 10/2012 |
| EP | 1 393 280 A1 | 10/2002 |
| EP | 1 363 306 A2 | 11/2003 |
| EP | 1 699 203 A1 | 9/2006 |
| EP | 2 051 422 A1 | 4/2009 |
| EP | 2 101 237 A2 | 9/2009 |
| EP | 10 2008 032 823 A1 | 1/2010 |
| EP | 2 209 262 A1 | 7/2010 |
| EP | 2 362 408 A1 | 8/2011 |

OTHER PUBLICATIONS

"Planning and Installation Manual," ODVA Cable System, 2002-2003, pp. 1-98, ODVA.

* cited by examiner

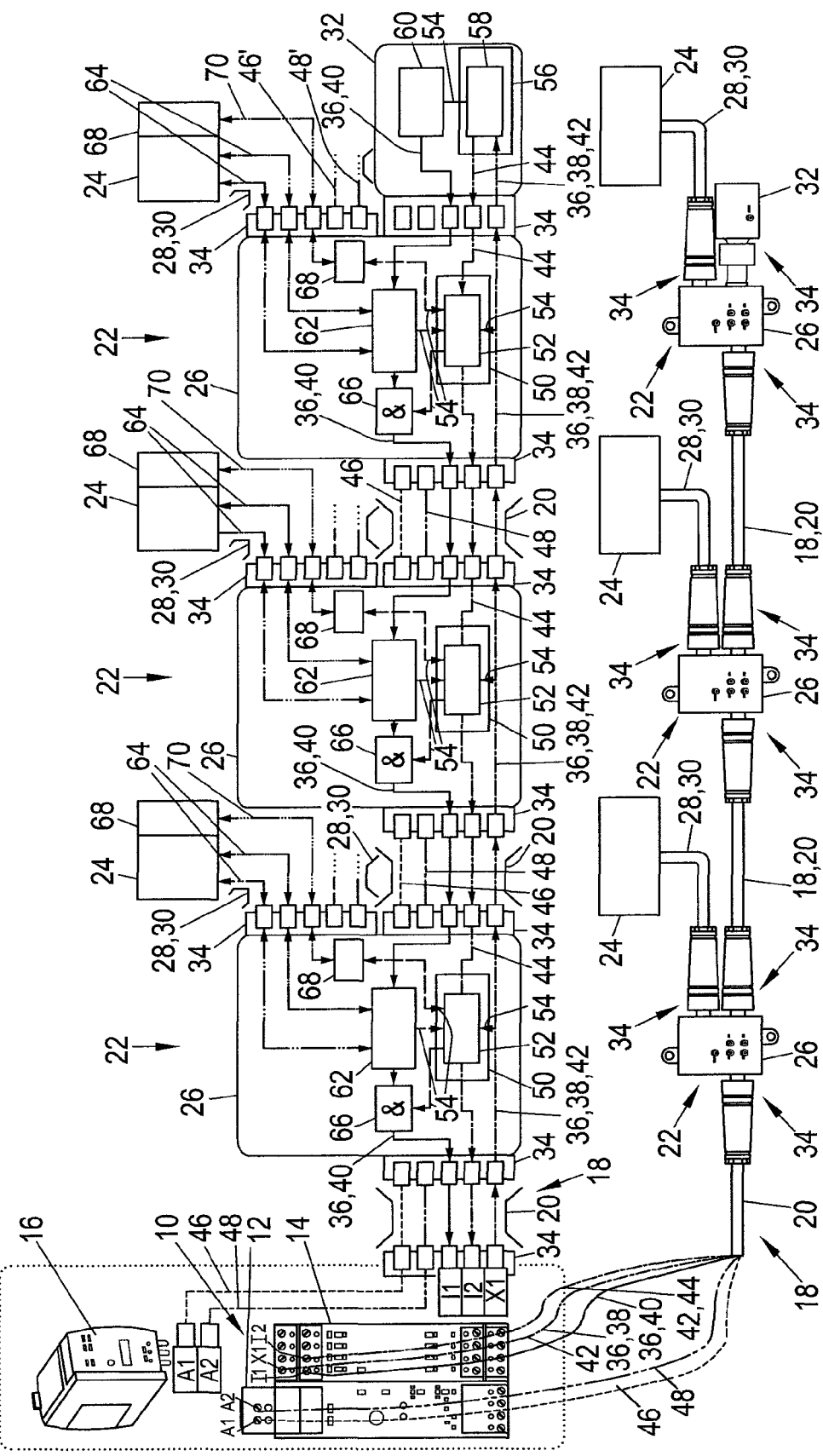

SAFETY SYSTEM

The present invention relates to a safety system which can, for example, be used for recognizing a hazardous situation at a safety critical plant or machine and for carrying out a safety related cutoff in the hazardous situation.

Safety systems of the mentioned kind typically comprise a safety unit, e.g. configured as a safety control, having an output and a safety input and at least one safety related participant comprising a protective device, wherein a test signal line and/or bus line connected to the output and the safety input together with the safety related participant forms a test signal path for transmitting a dynamic test signal generated by the safety control and wherein the protective device is configured to bring about an interruption of the test signal path on the presence and/or occurrence of a non-secure state. For example, a switch of the protective device arranged in the test signal path which is used as a direct transmission path of the test signal can be opened in such a way that the test signal path is interrupted. If the expected test signal remains absent at the safety input of the safety control due to such an interruption, then the safety control can carry out a safety related measure and it can, for example, interrupt the current supply to a safety critical plant and switch this off thereby, whereby the safety system satisfies a safety related function.

In order to satisfy particularly high requirements with respect to the achieved safety, multi-channeled protective devices are used, such as, e.g. two channeled equivalently opening safety switching devices having a first and a second switch which can be interrupted together on the occurrence of a non-secure state of the protective device. In this connection the two switches can be arranged in the common test signal path and can be electrically switched in series in such a way that the opening of one of the two switches already leads to a safety related cutoff and as a result thereof a redundancy is created by the protective function made available by the safety related participant.

A safety system can, however, also have a plurality of safety related participants connected to the bus line which can, e.g. be arranged locally distributed over the plant, wherein a non-secure state of an arbitrary protective device respectively leads to the triggering of the safety related function.

From the EP 1 393 280 A1 a safety system having a ring-shaped bus line is known, wherein a plurality of safety related participants and/or protective devices are arranged at the ring-shaped bus line and are connected in a ring-shaped topology and are switched in series via the bus line and are thereby cascaded. The ring-shaped bus line and the protective devices in this connection form the test signal path for the test signal. The test signal runs through all of the protective devices of the cascade in the series one after the other, wherein these are respectively adapted for the interruption of the test signal path on the occurrence of a non-secure state, in such a way that the test signal can then only be fed back to the safety unit on an error-free function of the safety system, when all of the protective devices are present in their secure state. The test signal received at the input of the safety unit thus makes available a summed information which states whether all protective devices are present in their secure state or not.

The direct integration of the protective devices into such a ring-shaped bus line leads to a significant demand in cabling on the use of a plurality of protective devices, since a section of the ring-shaped bus line is respectively required which runs to the respective protective device and a further section of the bus line separate therefrom which runs away from the protective device which requires a high overall length of the bus line in dependence on the local distribution of the protective devices with respect to one another.

In order to reduce the demand in cabling it is in principle possible to respectively connect the locally distributed protective devices to the bus line via an interconnection module connected to the bus line, wherein the protective device is respectively connected to the interconnection module via an individual interconnection line which is like a kind of stub line and is thereby connected to the bus line and is included in the test signal path. For such a topology, however, the danger of an error in the form of a cross-circuit between the line paths guided in the common interconnection line exists. For example, the danger of a cross-circuit between the two protective channels, this means between a forward line or a return line connected to one of the switches and a forward line or a return line connected to the other one of the switches exists on the connection of a two-channeled protective device having two switches via a common interconnection line. Such a cross-circuit leads to a bridging of one of the switches. In the case of a direct electrical series circuit, which is formed by the two switches together with the respective switching path in the interconnection module having the respective forward and return line, such a bridging of a switch means that an opening of the bridged switch remains without effect on the transmission of the test signal via the series circuit of both switching paths. Thereby the protective effect of this bridged switch and the thereby brought about redundancy of the two-channeled protective device is lost without this being recognized by the safety unit. Thereby the safety of the safety system is influenced.

It is the object of the invention to provide a safety system of the aforementioned kind which can be made available with a small demand in cabling and which at the same time ensures a high safety level.

In order to satisfy this object a safety system having the features of claim 1 is provided.

The safety system in accordance with the invention comprises a safety unit, in particular a safety control having an output and a safety input;

a bus line arranged between the output and the safety input of the safety unit; and at least one safety related participant connected to the bus line.

The bus line and the safety related participant form a test signal path having a forward path connected to the output of the safety unit and a return path connected to the safety input of the safety unit. The safety related participant comprises an interconnection module connected to the bus line, said interconnection module comprising a test signal input for an incoming test signal and a test signal output for an outgoing test signal and a protective device which is connected to the interconnection module via an interconnection line and which is included in the test signal path via the interconnection module. The protective device comprises two switches which are respectively connected to the interconnection module via a forward line and a return line of the interconnection line for the formation of a first and a second electrical switching path and which are included in the test signal path.

A secure protective device can, for example, be used as a protective device which comprises at least two switches and which is configured to take on a secure state in which the switches are closed in dependence on an outer influence relevant for the safety of e.g. a person or to take on a non-secure state in which the switches are open. It can, for example, be an emergency cutoff switch which comprises at least two switches which in the secure state, this means the non-actuated state of the emergency cutoff switch are closed and which are open in the non-secure state, this means the actuated state of the emergency cutoff switch. A further example is a locking apparatus of a safety door which comprises at least two switches which are closed in the secure position of the door, this means the closed position of the door and which are open in the non-secure position of the door, this means in the open position of the door. The protective device can, for example, also comprise one or more further switches in addition to the at least two switches, which further switches, for example, can be included in series into the test circuit path as will be described in the following for the formation of an electrical switching path, in such a way that they close or interrupt the test signal path in dependence on their switching state.

The interconnection module comprises a test circuit for the at least two switching paths which comprise at least one controlled current source, a controlled current sink and a current direction element. In this connection the test signal input of the interconnection module is connected to a control input of the controlled current source or of the controlled current sink in such a way that the controlled current source or current sink is controlled by the incoming test signal or a signal derived therefrom. A controlled output of the same one of the current source and the current sink is connected to the forward line of the first switching path in order to transmit a current via the first switching path. The return line of the first switching path is connected to the control input of the respectively other one of the controlled current source and the controlled current sink in such a way that the controlled current source or current sink can be controlled by the current signal transmitted via the first switching path or a signal derived therefrom.

A controlled output of the other one of the controlled current source and current sink of the test circuit is connected to the forward line of the second switching path in order to transmit a current via the second switching path.

The return line of the second switching path is either directly or indirectly connected to the current direction element which is configured to provide a signal dependent on the current transmitted via the second switching path, in particular on its orientation. The test signal output of the interconnection module is finally connected to the current direction element in order to output the signal generated by the current direction element or a signal derived therefrom as an outgoing test signal of the safety related participants.

The previously described safety system requires a significantly reduced demand in cabling and at the same time has a high safety level. A protective device configured as a two-channeled safety switching device having two switches is connected to the bus line via an individual interconnection line and an interconnection module connected thereto and is integrated into the test signal path in the safety system in accordance with the invention. The interconnection line thus integrates the protective device into the test signal path by means of a kind of stub line coming off from the bus line, whereby the demand in cabling with respect to a connection in which the ring-shaped bus line is directly guided over the protective device is considerably reduced.

In this connection it is prevented that a cross-circuit arising in the interconnection line between the two electrical circuit paths respectively comprising a switch of the protective device leads to an unnoticed loss of the redundancy of the protective function intended by the two switches and in this way to an interference of the safety through the test circuit made available in the interconnection module. In contrast to this, the test circuit is configured to carry out a transmission and/or a forwarding of the dynamic test signal received at the test signal input which is not orderly in the case of such a cross-circuit and which deviates with respect to its behavior on an error-free operation and which rather provides a signal at the test signal output which violates the expectation of the safety circuit with respect to the dynamic test signal which violation leads to an activation of the safety related function of the safety unit.

The function of the test circuit is based on the recognition that in the error-free operation and in the secure state of the protective device the current is driven through the first and the second paths in different directions, since the current is driven through one of the electrical switching paths by a current source which generates an outgoing electrical current flow and the current is driven through the other electrical switching path by the current sink which generates an incoming electrical current flow. For this reason a cross-circuit between both switching paths leads to a change in direction of the current flow in the electrical switching path connected to the current direction element or at least to a reduction of the current flowing in the expected current flow direction in comparison to an error-free operation, this means in absence of a cross-circuit between both switching paths. The current direction element can recognize the presence of such a deviation of the current flow from the current flow of an error free operation and can ensure that a test signal is output and/or present at the test signal output of the safety related participant which deviates from the test signal transmitted during the error-free operation and which violates the expectation of the safety control and thus leads to an activation of the safety related function.

It is thereby avoided that the presence of a cross-circuit between the two electrical switching paths in the interconnection line, as described above, remains unrecognized and leads to a loss of the redundant protective effect intended by the two switches of the protective device.

Since the safety related participants are electrically connected in series to one another, via the test circuit in accordance with the invention and its components and are serially integrated into the test signal path it is ensured that, for example, an opening caused by the occurrence of a non-secure state of the protective device of at least one switch or an interruption of a forward and return line in the interconnection line likewise leads to the desired triggering of the safety related function. In this case, namely no stimulation of the current source and/or current sink by means of the incoming test signal takes place. Thus, no test signal corresponding to the expectation of the safety unit is output at the test signal output of the safety related participant in this case. The connection in accordance with the invention thus corresponds to a common series circuit also with regard to its serial character, wherein an additional cross-circuit recognition is ensured as was previously described.

In this way, a high safety level is achieved albeit the less demanding connection of the protective device to the bus line with regard to the manner of cabling technology used, the cabling being carried out via individual stub lines coming off from the bus line and albeit the thus inherent possibility of a cross-circuit between the two switching paths in such a way that a safety system is finally achieved which can be made available with a lesser demand in effort and cost and which at the same time has a high safety level. Thus, a safe, one-channeled inclusion of a two-channeled protective device into the safety system and a safe imaging of the secure or non-secure state of the protective device on the test signal path is achieved which can be configured via an individual interconnection line.

A further advantage of the invention consists therein, that the test circuit can be assembled completely from discrete electrical or electronic elements and/or components and the dynamic of the signals generated by the test circuit can be generated purely by means of the dynamics of the incoming test signal. The test circuit thus does not require a time base independent from that of the incoming test signal for the generation of the corresponding signals. Thereby the error susceptibility of the test circuit is reduced to a minimum. Moreover, the test circuit can output a test signal during the functional operation of the safety related participants which substantially corresponds to the incoming test signal and is, in particular not, or at least substantially not, delayed with respect to this in such a way that the operation of the remaining safety system is not influenced by the test circuit.

Advantageous embodiments of the invention are described in the subordinate claims, the description and the Figures.

The safety unit can in principal comprise a safety component, such as, e.g. a safety relay, a safety sensor, a safety actor or a similar safety component which has an output and a safety input for an output signal and/or a test signal.

Preferably the safety unit is formed by a safety control which is preferably adapted to carry out a safety related measure on the absence of the expected test signal and to actively control, in particular a monitored plant or an installation connected thereto in order to transfer the plant into a secure state. For example, the safety control can bring about an interruption of the current supply to the plant, in particular by controlling a relay arranged in a current supply line. The safety control can comprise a digital logic unit which can comprise one or more microprocessors and which preferably controls the transmission of the output signal and/or the evaluation of the incoming test signal.

When in the following the advantageous embodiments of the invention are explained with reference to a safety control these explanations are to be generally related to the application of the invention to a safety unit, with the realization of the invention being illustrated by means of a preferred embodiment of a safety controller.

The safety system is preferably adapted to generate a dynamic test signal, this means a test signal variable in time and to transmit the test signal via the bus line and the test line path arranged therein to the test signal input of the safety related participant. This test signal is preferably generated by the safety control can, however, also be generated by a termination element of the safety system in accordance with a specific embodiment described in the following. The test signal is preferably configured as a binary direct current or direct voltage signal which varies between a predefined high current and/or voltage level ("High"), and a predefined low current level and/or voltage level ("Low"). For example, the test signal configured as a direct voltage signal can vary between a high voltage level, such as, e.g. 42 V and a low voltage level of e.g. 0 V or ground potential.

Preferably, also the components of the test circuit are adapted to generate binary current and/or voltage signals during the error-free operation of the safety related participants which signals respectively vary between a high signal level and/or current or voltage level ("High") and a low signal level and/or current or voltage level ("Low").

The dynamic test signal can have periodically arising test gaps, e.g. at a predefined cycling time, having a predefined duration, wherein the signal respectively has a continuous low signal level during the test gaps and between two test gaps following one another has a continually high signal level.

An expectation with respect to the test signal received at the safety input of the safety control is preferably stored in the safety control and the safety control is adapted to check whether the actually received test signal corresponds to this expectation and otherwise to carry out and/or to initiate a safety related measure. For example, the expectation can comprise the fact that the incoming test signal has an expected dynamic. It can likewise be checked that a maximum allowable deviation in time or delay between the point of time at which a test gap of the incoming test signal is expected and the actual presence of a test gap in the test signal is not exceeded and/or that the duration of a test gap of the incoming signal corresponds to an expected test gap duration. Thus, for example, a continuous presence of a low signal level ("Low") at the safety control, e.g. due to an interruption of a protective device, leads to an activation of the safety related function and, in particular to a triggering of a safety related cutoff, just like an absence of an expected test gap due to a so-called "Stuck-at-High" error, this means due to a continuously present high signal level ("High").

The controlled current source can be configured as an active current source, preferably as a direct current source and can be adapted to actively generate a positively outgoing electrical current flow with respect to the technical current flow direction which current flow depends on the control signal present at its control input. Preferably, the current source generates an outgoing direct current whose value is dependent on the value of the current and/or the voltage of the current and/or voltage signal present at the control input and is predefined by this. In this connection a high level of the controlling signal can correspond to a high level of the current signal generated by the current source and a low level of the controlling signal correspond to a low level of the current signal generated by the current source, this means the current source is thus configured as a non-inverting current source. Likewise, the current source can be configured as an inverting current source, this means that a high level of the controlling signal corresponds to a low level of the current signal generated by the current source and a low level of the controlling signal corresponds to a high level of the current signal generated by the current source. A high level of the current signal generated by the current source in this connection means a high positive outgoing current flow of, e.g. 10 mA and a low level corresponds to a small positive outgoing current flow of e.g. 0 mA.

The controlled current sink can be configured as an active current sink, preferably as a direct current sink and can be adapted to actively generate a positive incoming electrical current flow with respect to the technical current flow direction, this means a negative outgoing electrical current flow, which current flow depends on the control signal present at its control input. Preferably, the current sink generates an incoming direct current whose value is dependent on the value of the current and/or the voltage of the current and/or voltage signal present at its control input and is predefined by this. In this connection, a high level of the controlling signal can correspond to a high level of the current signal generated by the current sink and a low level of the controlling signal can correspond to a low level of the current signal generated by the current sink, this means that the current sink is configured as a non-inverting current sink. Likewise, the current sink can be configured as an inverting current sink, this means that a high level of the controlling signal corresponds to a low level of the current signal generated by the current sink and a low level of the controlling signal corresponds to a high level of the current signal generated by the current sink. A high level of the current signal generated by the current sink in this connection means a high positive incoming current flow of e.g. 10 mA and a low level of a smaller positively incoming current flow of e.g. 10 mA.

The power consumption of the test circuit, also in the case of error, such as e.g. a cross-circuit between both switching paths, can be maintained small through the use of such current sources and/or current sinks.

The current source and the current sink can be matched to one another, in particular with regard to the high and low current level delivered by them during the error-free operation such that in the case of a cross-circuit between both switching paths an inversion of the current direction results at the current direction element or at least a significant deviation of the current flow from the current level expected on an error-free operation which is present at least for a certain period of time.

The current source and the current sink can respectively be configured as a voltage or a current controlled current source and/or current sink.

Preferably, at least that one of current source or current sink which is connected to the forward line of the first switching path is adapted or configured such that a current directed against the operational current direction of the current source and/or current sink is avoided at its controlled output, this means that an incoming current for the current source and/or an outgoing current for the current sink is avoided. The current source and/or the current sink can in this connection itself be configured in such a way that such a current is avoided. Alternatively or additionally an additional component can be arranged between the output of the current source and/or current sink and the forward line of the first switching path which prevents such a current, for example, a diode or a similar blocking element polarized in an operating current direction of the current source and/or current sink.

The current direction element is adapted to recognize when a cross-circuit is present between the two switching paths by means of the current flowing through the current direction element. The current direction element can recognize when a current flow deviating from the expected current flow is present at its input differing from the expected current flow present on an error-free operation of the safety related participant. At least time wise an inversion of the direction of the current flow at the current direction element can be set or at least a deviation of the value of the current flowing in the expected direction can deviate from the expected level on an error-free operation, at least for a certain period of time, in dependence on the setting of the current source and current sink and/or their respectively high and low current level. Such a deviation can be recognized by the current direction element.

In accordance with an advantageous embodiment the current direction element is adapted to recognize when a current flow having a direction opposed to that of the expectation is present at the current direction element on an error-free operation of the safety related participant, this means in absence of a cross-circuit between both switching parts. When e.g. the current sink is connected to the second switching path, to transmit a current signal via this, a positive outgoing current flow is expected at the current direction element. Vice versa, for an alternative configuration, in which the current source is connected to the second switching path, to transmit a current signal via this, a positive incoming current is expected at the current direction element. A cross-circuit can correspondingly be recognized by the current direction element on the basis of a reversal of the current direction. In the case of such a recognition, the current direction element preferably outputs a signal which leads to a triggering of the safety related function of the safety control The current direction element can also be adapted to recognize when a current flow is indeed present at the current direction element having a direction corresponding to that of the expectation on an error-free operation of the safety related participant, whose value, however, at least for a certain period of time, undercuts the level expected on an error-free operation. Thus, a cross-circuit between both switching paths can also be recognized then when this does not lead to a reversal of the current direction, but to an unexpected value of the current directed in the expected direction, at least for a certain period of time, e.g. a value which is below the expected high level and which is above the expected low level. Preferably, the current direction element outputs a signal in this case which leads to a triggering of the safety related function of the safety control.

In accordance with an advantageous embodiment the current direction element is adapted to output a signal having a continuously substantially constant level on the recognition of a non-error-free operation, for example, in the case of a previously described cross-circuit recognition on the basis of an unexpected current signal with respect to its direction or to its value. Such a signal does not have the dynamics expected by the safety control and thus reliably leads to a triggering of the safety related function of the safety control.

Preferably, the outgoing test signal provided at the test signal output of the safety related participant in the error-free operation of the safety related participant and in the closed state of both switching paths substantially corresponds to the incoming test signal, this means at least with respect to the properties checked by the safety control and its expectation, such as, in particular the signal shape and the signal synchronicity and/or timing.

For example, the current direction element can generate a direct current signal or preferably a direct voltage signal at its output, as long as the current flowing through the current direction element varies between an expected low level of e.g. 0 mA and an expected high level of e.g. 10 mA, which direct current signal or direct voltage signal corresponds to the current signal received at its input, this means that a high current level of the incoming current signal corresponds to a high current and/or voltage level of the outgoing signal of the current direction element and a low current level of the current signal corresponds to a low level of the outgoing current signal and/or voltage signal of the current direction element. The current direction element is preferably configured as an electrical load or as a passive electrical element or component.

Preferably, the test circuit is adapted to carry out a signal inversion between the return line of the first switching path and the control input of the current source or current sink connected to the forward line of the second switching path. The inversion can take place in such a way that a high level of the current signal transmitted via the first switching path corresponds to a low level of the current signal transmitted via the second switching path and that a low level of the current signal transmitted via the first switching path corresponds to a high level of the current signal transmitted via the second switching path. This inversion has the effect that only one of the current source and the current sink generally transmits a current having a high level at one point in time. Thereby, the recognition of a cross-circuit is simplified, in particular on the basis of a reversal of the current direction.

The previously described inversion can be carried out by an inverter which is arranged between the return line of the first switching path and the control input of the current source and/or current sink connected to the forward line of the second switching path, in particular when the current source and/or current sink connected to the forward line of the second switching path is non-inverting. Likewise, it is possible that the inversion is itself carried out by the current source and/or the current sink connected to the forward line of the second switching path, when this is configured as an inverting current source and/or current sink.

The test circuit can be adapted to carry out a further signal inversion. It can thereby be insured that the test signal of the safety related participant outgoing from the test signal output of the safety related participant during the error-free operation of the safety related participant and for closed switching paths substantially corresponds to the test signal incoming at the test signal input. For example, the test circuit can carry out a signal inversion between the test signal input and the control input of the current source or current sink connected to the test signal input. This inversion can mean that a high level of the test signal incoming at the test signal input corresponds to a low level of the current signal transmitted via the first switching path and that a low level of the test signal incoming at the test signal input corresponds to a high level of the current signal transmitted via the first switching path. This inversion can, for example, be carried out by an inverter which is arranged between the test signal input and the control input of the current source and/or current sink connected to the forward line of the first switching path, in particular when the current source and/or current sink is configured as non-inverting. However, also an inverting current source and/or current sink can be used, in which case a separate inverter can be omitted. Likewise, the test circuit can carry out a signal inversion between the current direction element and the test signal output.

In accordance with an advantageous embodiment a current flow element of the test circuit is arranged between the return line of the first switching path and the control input of the current source or current sink connected to the forward line of the second switching path, said current flow element being configured to receive a current signal at its input transmitted via the forward line of the first switching path and to output a direct voltage signal at its output which depends on the received current signal. In this connection the current flow element can be adapted in such a way that a high current level of the incoming current signal corresponds to a high voltage level of the outgoing voltage signal and that a low current level of the incoming current signal corresponds to a low voltage level of the outgoing voltage signal. The current flow element is preferably adapted as an electrical load or as a passive electrical element or as an electrical component. The outgoing voltage signal of the current flow element can be used for the control of the current source and/or current sink connected to the forward line of the second switching path, wherein this is configured as a voltage controlled current source and/or current sink. However, also a current controlled current source and/or current sink can be used which is directly controlled by means of the current signal transmitted via the first switching path, this means without a current flow element being switched therebetween.

In accordance with an advantageous embodiment, a dynamic unit of the test circuit is arranged between the current direction element and the test signal output which dynamic unit is adapted to receive a signal at its input which is output by the current direction element or a signal derived therefrom and to output a signal whose shape depends on whether the received signal has an expected dynamic. Preferably, the dynamic unit is adapted to forward the received signal in a substantially unchanged manner when the received signal has the expected dynamic. When the received signal does not have the expected dynamic, the dynamic unit preferably outputs a signal having a substantially constant level, in particular having a constant high level or a constant low level. In this connection the dynamic unit can image both a constant high level of its input signal and a constant low level of its input signal onto the same, preferably either high or low, level of its output signal. The uniform imaging both of a constant high level and of a constant low level onto the same level leads to a reduction of the possible states present at the output of the safety related participant, preferably to a single state, said state leading to a triggering of the safety related function. Through this reduction in state it is simplified to differentiate between a case of cutoff, this means the presence of a non-secure state of a safety related participant and a system error at the safety control on the basis of the incoming test signal.

The test circuit of the interconnection module can at least partly and preferably be completely assembled from discrete components, wherein preferably at least the current source, the current sink and the current direction element are formed by separate discrete components. The test circuit can thus be realized without integrated circuits. Preferably the test circuit has an own time base independent from the test signal. In the framework of the test circuit one can thus completely do without components, such as e.g. clocked microprocessors, which are clocked by their own time base. Rather more the dynamic of the signals generated by the test circuit is generated by the dynamics of the incoming test signal is preferably only generated by the dynamics of the incoming test signal, in particular in that the incoming test signal controls the controlled current source and current sink. The reliability of the test circuit is significantly increased through the omission of integrated circuits and/or of electrical or electronic elements clocked with an own time basis, since functional errors associated with the use of the previous elements are prevented. Moreover, the time delay of the test signal inherent with the use of such elements is avoided in such a way that the outgoing test signal of the safety related participant can be output substantially without a delay with respect to the corresponding incoming test signal, whereby a low reaction time of the safety system is ensured.

The protective device and the interconnection module of the safety related participant are preferably arranged separate from one another in position and each comprise an own housing, wherein a housing is configured, preferably in accordance with the housing protective type IP 67 or IP 20 or a different housing type protecting against contamination or humidity. The interconnection line is preferably formed by a common interconnection cable including the forward line and the return line of the two switching paths. The bus line is preferably formed by one or more bus cables which connect the safety control to the interconnection module, wherein the safety control is preferably arranged in a switching cabinet locally separate from the safety related participant.

If the safety system comprises a plurality of safety related participants these are preferably arranged distributed about the plant or machine to be monitored and are connected to one another via bus cables of the bus line. The safety system can be configured as a field bus system, this means that the components of the safety system, in particular a plurality of safety related participants of the bus system, are arranged locally distributed. The spacing between two different safety related participants or between a safety related participant and the safety control can in this connection be considerable and e.g. amount to one or more meters. An interconnection cable or a bus cable preferably runs outside of the housing and is preferably configured with a standard sensor/actor cable protecting against contamination or humidity and is suitable as well as allowable for the laying outside of housings, for example, of the type M 12 having a core and/or conductor cross-section of preferably at least $0.34$ $mm^2$. The connections between the cable and/or the interconnection cables and the safety control, the interconnection module and the protective device are preferably realized by plug connectors, e.g. of the type M 12. A bus cable can have a length of e.g. one or more meters in accordance with the spacing between the safety related participants.

A switch of the protective device is preferably configured as a mechanical electrical switching contact which, for example, can be actuated mechanically, for example, a mechanically actuatable switching contact of a protective device configured as an emergency cutoff switch or it can be electronically actuatable, such as e.g. the switching contact of a safety relay. The switching contact can also be magnetically actuatable, such as e.g. the switching contact of a Reed switch which, for example, can be used for a protective device configured as a door lock and which can be closed and/or interrupted by closing and opening the door. The protective device is preferably a safety switching device having two equivalently opening electrical switches which can be respectively formed by a previously described switching contact, wherein both switches are closed in the secure state of the protective device and are open in the non-secure state. Preferably, the two switches of the protective device are adapted to substantially simultaneously switch on a change from the secure state into the non-secure state and vice versa.

As was previously described the protective device is preferably configured to open the two switches together on the occurrence of a non-secure state of the protective device and thereby to interrupt the associated electrical switch path. In accordance with an embodiment which is described in detail in connection with the description of the Figures, the safety related participant comprises an interruption switch arranged in the test signal path and an evaluation unit which is preferably a part of the interconnection module which is connected to the first and the second switching path and which is adapted to check whether the first and the second switch path have been interrupted together and to open the interruption switch when the two switching paths have not been interrupted together.

Thereby it can be recognized locally at the safety related participant when the desired common switchability of the two switching path is no longer ensured, but rather a discrepancy is present at the two switching paths and thus an error function of the safety related participant is present. Such an error function, which is also referred to as a discrepancy error can, for example, be brought about by a fusing of one of the switching contacts of the protective device which prevents an orderly opening of the switching contact on the occurrence of a non-secure state of the protective device. The check by means of the local evaluation unit represents an important additional protective function. Indeed an interruption of the test signal path and in this way a safety related cutoff is brought about also for an orderly triggering of only one protective channel, this means on an opening of only one single switch as a consequence of the series connection realized in the test circuit of the two switches; however, the redundancy intended by the provision of the two switching paths and in this way the inherently increased safety is lost. However, the error recognition by the evaluation unit prevents a first error in the form of such an error function of a switch remaining unrecognized and being tolerated and thereby the possibility of an error accumulation is provided such that an error function of the other switch leads to a complete loss of the securing function of the safety related participant.

The evaluation unit can also serve the purpose of recognizing a line error, such as, in particular a short circuit or a cross-circuit which can arise between the forward lines and the return lines of the at least two switching paths which connect the switches of the protective device to the interconnection module in which the evaluation unit is preferably received.

In order to check the switching state of the electrical switching paths, the evaluation unit can, e.g. be respectively connected to the forward line and the return line between which the respective switch is connected in series. In this case the evaluation unit can also recognize a line error, such as, in particular a short circuit or a cross-circuit between the forward line and the return line. For example, a short circuit between the forward line and the return line of a switching path or also a cross-circuit between the forward line or the return line of a switching path and the forward line or the return line of the other switching path respectively appear as a continuously closed first and/or second switch and/or switching contact from the point of view the evaluation unit and for this reason lead to a discrepancy error e.g. like for a fused switching contact in such a way that the evaluation unit can also recognize such an error. Thereby the safety of the system is even further increased.

When the safety related participant and/or the protective device have one or more further switches and/or switching paths in addition to the first and the second switch which can be interrupted together with the first and the second switching path on the occurrence of a non-secure state of the protective device, the evaluation unit preferably checks whether all switching paths of the safety related participant interruptible in common were interrupted together and otherwise opens the interruption switch.

In accordance with an advantageous embodiment the evaluation unit is configured to check whether the two switching paths of the safety related participant can be interrupted at the same time at least apart from a predefined discrepancy time. Likewise, the evaluation unit can be configured to check whether the two switching paths were simultaneously closed apart from a predefined discrepancy time, for example, on a starting or a restart of the safety system. Such a start monitoring can be realized separate from the monitoring of the common interruption of the switching paths. In order to monitor the simultaneousness of the interruption and/or the simultaneousness of the closure, the evaluation unit can, for example, comprise a correspondingly adapted microprocessor or have an own time base, such as e.g. a clock generator of the microprocessor.

In accordance with a further embodiment of the invention which is likewise described in detail in connection with the description of the Figures the safety system has at least one further safety related participant comprising a protective device connected to the bus line, which safety related participant is adapted in such a way that the presence of a non-secure state of its protective device brings about an interruption of the test signal path. In this connection both safety related participants can be configured as two channeled safety switching devices having a previously described test circuit. A plurality of and preferably all of the safety related participants of the system are arranged along the bus line in a line in such a way that both the forward path and also the return path of the test signal path run through the same safety related participants. The safety system further comprises a termination element preferably connected at the end of the line and connecting the forward path and the return path of the test signal path. The safety control is configured to transmit an output signal and/or a test signal at its output connected to the forward path. The termination element is configured to receive the output signal from the forward path and to output a test signal to the return path of the test signal path in dependence on the output signal received from the forward path, said test signal being changed with respect to the received output signal.

In this design the forward path and the return path of the test signal path thus run through the same safety related participants. The test signal input and the test signal output of the respective safety related participant having the test circuit of the safety related participant arranged there between are in this connection preferably integrated into the return path of the test signal path. The forward path of the test signal path is preferably looped through the safety related participant without the possibility of interruption.

Due to the fact that both the forward path and the return path of the test signal path run through the same safety related participants a line topology of the bus line and of the safety related participants connected to the bus line is realized. The required demand in cabling is thereby even further reduced with respect to a ring topology of the bus line, since it is not required to guide the forward path and the return path of the test signal path in separate cables. In contrast to this these can at least regionally be guided in a common cable from a safety related participant to the next. The termination element arranged at the end of the line and the change and/or signal conversion of the output signal received by the termination element from the forward path into a test signal output to the return path in this connection serves the purpose of recognizing a cross-circuit between the forward path and the return path of the test signal path. The expectation with regard to which the safety control checks the test signal received at the safety inputs is in this connection preferably configured in such a way that the satisfaction of the expectation presupposes the signal change and/or conversion carried out by the termination element and a bridging of the termination element as a consequence of a cross-circuit between the forward path and the return path of the test signal path leads to a violation of the expectation and thus to a triggering of the safety related function, for example, when, as a consequence of the cross-circuit, a test signal is received which is unchanged with respect to the transmitted output signal. Thus, a high safety level is achieved for a low demand in cabling albeit the line topology and the in this connection existing possibility of a cross-circuit between the forward path and the return path of the test signal path.

The safety system and the herein described safety related functions preferably satisfy the safety level SIL 3 in accordance with the norm IEC 61508 and/or the safety level performance level e ("PL e") in accordance with the norm EN ISO 13849-1. The safety input of the safety control preferably comprises a secure input. The secure input is characterized by an error safe evaluation of the signal incoming into the safety control for which purpose, for example, a two-channeled evaluation can take place which is, for example, carried out by two redundant microprocessors controlling one another and working in parallel.

The invention also relates to an interconnection module for a safety related participant in accordance with claim 14 which is configured for the use in a safety system in accordance with the invention as is described herein and comprises a test circuit as described herein. The advantageous embodiments of the interconnection module and the corresponding advantages described herein with reference to the safety system in accordance with the invention and, in particular with reference to the test circuit are correspondingly true.

The interconnection module in accordance with the invention comprises
  at least one test signal path which is arranged between a test signal input for an incoming test signal and a test signal output for an outgoing test signal of the interconnection module;
  a first and a second pair of a respective signal input and a respective signal output, wherein the signal input and the signal output of a pair are respectively configured for the integration of an electrical switching path into test signal path; and
  a test circuit for the two switching paths which comprises a controlled current source, a controlled current sink, a current flow element and a current direction element;

The test signal of the interconnection module is connected to a control input of the controlled current source or of the controlled current sink in such a way that the controlled current source or current sink can be controlled by the incoming test signal or by a signal derived therefrom. A controlled output of the same one of the current source and the current sink is connected to the signal output of the first pair of signal output and signal input in order to transmit a current signal via the first switching path. The signal input of the first pair of signal input and signal output is connected to the controlled input of the respective other one of the controlled current source and the controlled current sink in such a way that the controlled current source or current sink can be controlled by the current signal transmitted via the first switching path or by a signal derived therefrom. A controlled output of the other one of the controlled current source and current sink is connected to the signal output of the second pair of signal input and signal output in order to transmit a current via the second switching path. The signal input of the second pair of signal input and signal output is finally connected to the current direction element which is configured to provide a signal in dependence on the current transmitted via the switching path, in particular in dependence on its direction. The test signal output of the interconnection module is connected to the current direction element in order to output the signal generated by the current direction element or a signal derived therefrom as an outgoing test signal of the safety related participant.

Figure 2:
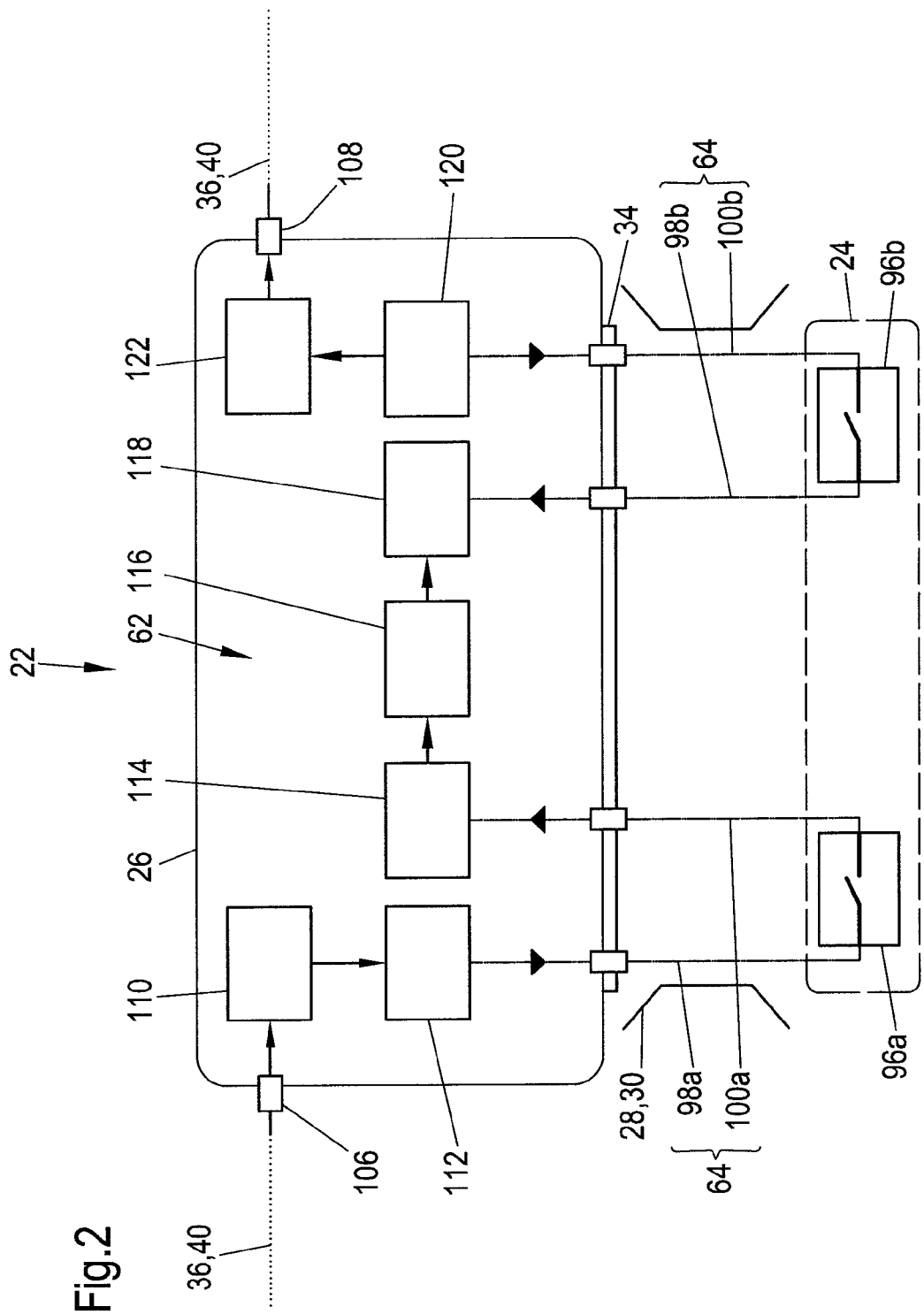
Figure 3:
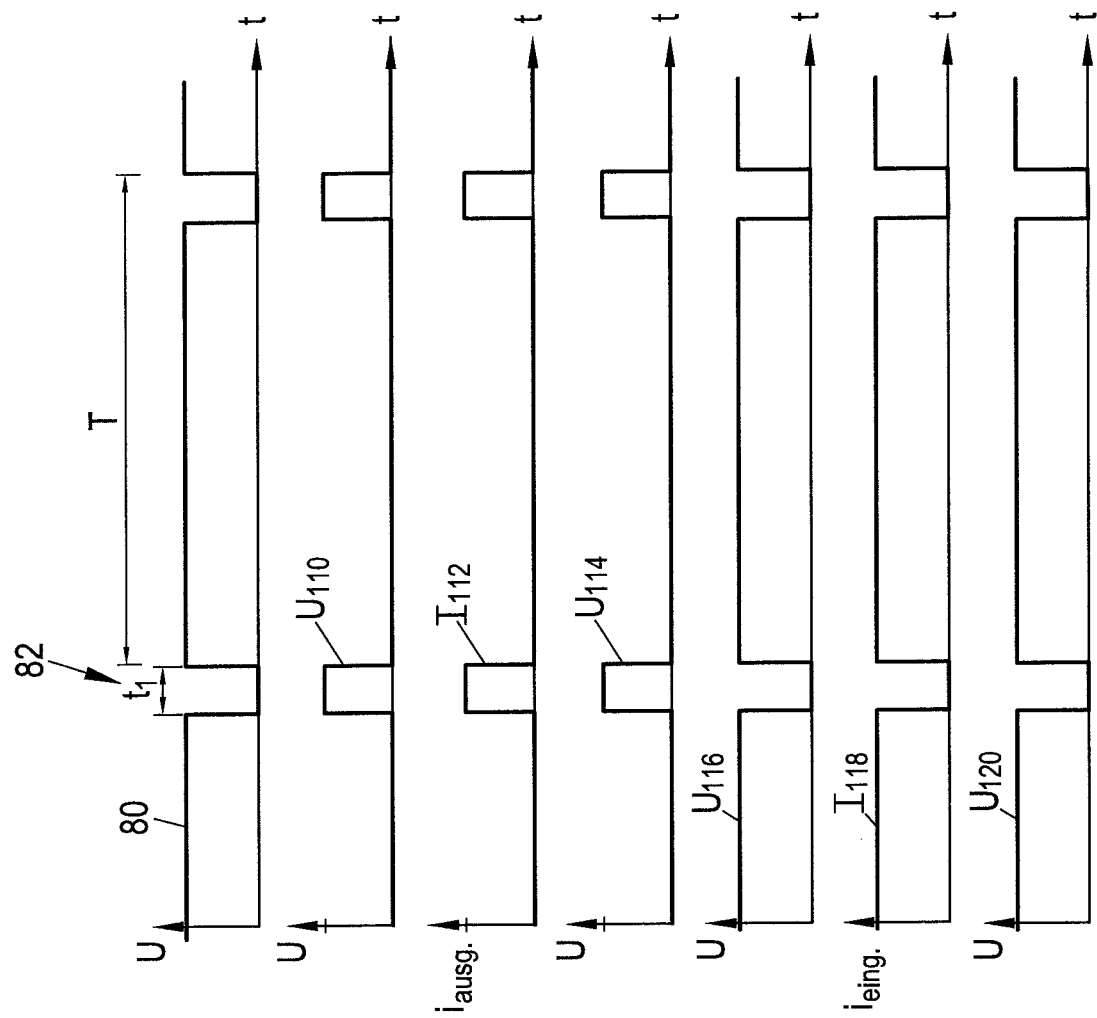
Figure 4:
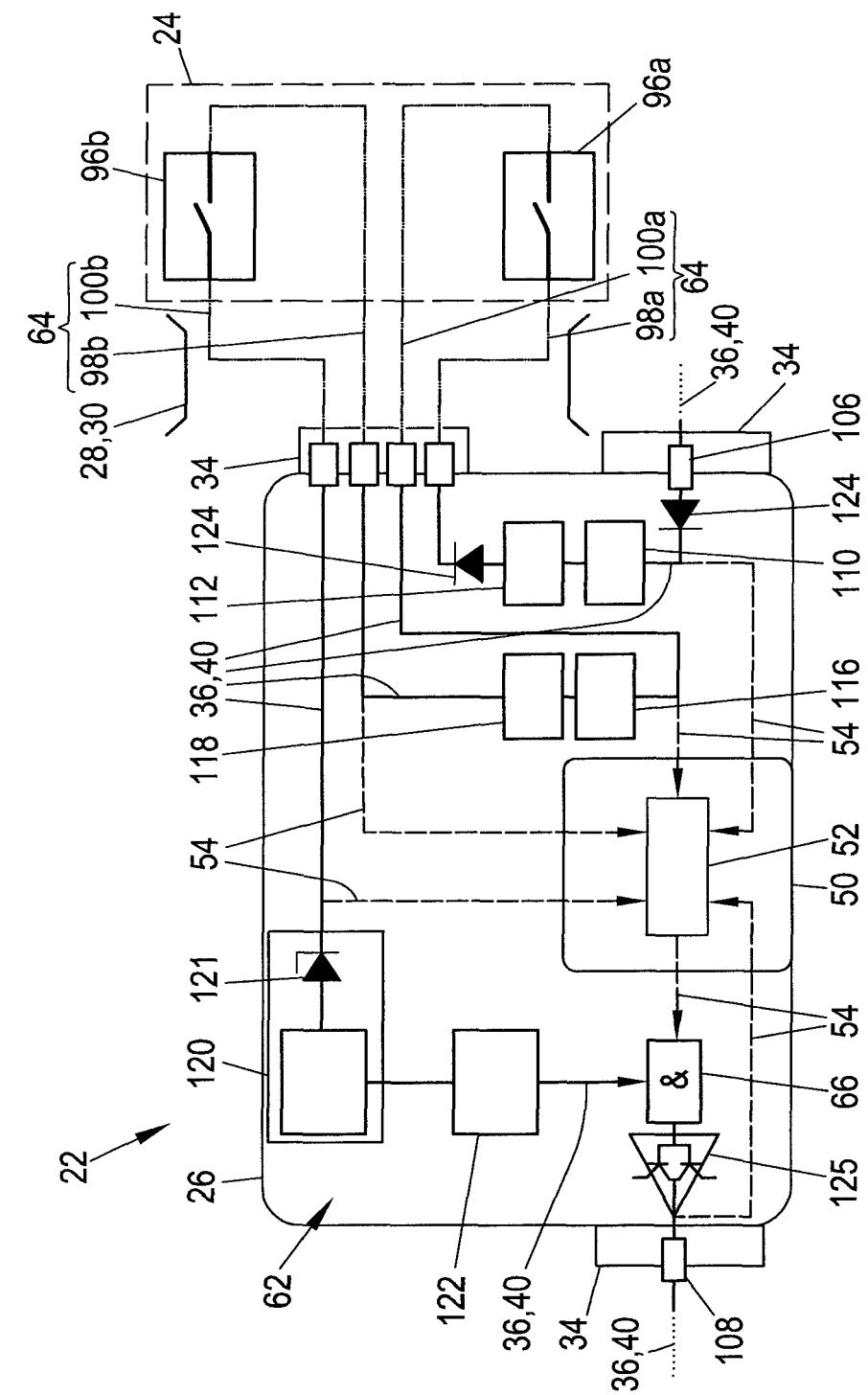

The invention will be described by way of example in the following by means of an advantageous embodiment with reference to the submitted drawings. There is shown:

FIG. 1 a safety system in accordance with an embodiment of the invention in a schematic illustration;

FIG. 2 a safety related participant of a safety system in accordance with an embodiment of the invention;

FIG. 3 exemplary current signals and voltage signals transmitted by the test circuit of the safety related participant of FIG. 2;

FIG. 4 a further possible safety related participant of a safety system in accordance with an embodiment of the invention; and FIG. 5 a safety system in accordance with a further embodiment of the invention.

FIG. 1 shows a safety system in accordance with an embodiment of the invention. The safety system comprises a safety control 10, which can be arranged in a switching cabinet and can comprise an output X1 as well as safety input I1.

The safety system comprises a bus line 18 having a plurality of bus cables 20, wherein one of the bus cables 20 is connected to the output X1 and one of the bus cables 20 is connected to the input I1 of the safety control 10. The safety system further comprises a plurality of safety related participants 22 which are connected to the safety control 10 via the bus cables 20 of the bus line 18. The safety related participants 22 respectively comprise a protective device 24 and an interconnection module 26 which is connected to the respective protective device 24 via an interconnection line 30 formed by an interconnection cable 28 and which is directly connected to the respectively adjacent bus cable 20. The protective devices 24 are thus connected to the bus line 18 via individual interconnection cables 28 respectively forming a stub line.

The connections of the safety control 10 of the protective devices 24 and the interconnection modules 26 to the cables 20 and to the interconnection cables 28 are respectively formed by an electrical plug connection 34, for example, composed of a plug connector, such as of the type M 12 of the one element and a corresponding plug socket of the other element.

A cable is respectively illustrated in the Figures by two brackets facing one another which represent the jacket of the cable, wherein generally one of the brackets is provided with the corresponding reference numeral, this means the reference numeral 20 for a bus cable and/or the reference numeral 28 for an interconnection cable. The one or more lines respectively drawn in between the brackets of a cable respectively represent an electrical line arranged in the respective cable which can be composed of one or more electrical conductors arranged in the cable jacket.

The bus line 18 and/or the respective conductors of the bus cable 20 of the bus line 18 and the safety related participants 22 connected to the bus line 18 form a one channeled, ring-shaped test signal path 36 having a forward path 38 connected to the output X1 of the safety control 10 and a return path 40 connected to the safety input I1 of the safety control 10.

The protective devices 24 of the safety related participants 22 are configured as two-channeled safety switching devices which respectively comprise two equivalently switching electrical switches 96a, 96b which on the occurrence of a non-secure state of the protective device 24 are together interrupted and/or opened which switches respectively form a protective channel of the protective device 24. In particular a protective device 24 can, for example, be a two-channeled emergency cutoff switch whose switches 96a, 96b are closed in the secure state of the emergency cutoff switch, this means the non-actuated state of the emergency cutoff switch and whose switches 96a, 96b are open in the non-secure state of the emergency cutoff switch, this means the actuated state of the emergency cutoff switch. Likewise, it can be a locking apparatus of a safety door, wherein the switches 96a, 96b are closed in the secure state, this means for a closed safety door and the switches 96a, 96b are open in the non-secure state, this means for an open safety door. The switches 96a, 96b are respectively connected to the interconnection module 26 via a forward line 98a or 98b and a return line 100a and/or 100b of the interconnection cable 28, wherein each switch 96a, 96b forms a respective electrical switching path of the safety related participant 22 with the associated forward and return line 98a, 98b, 100a, 100b. These interruptible switching paths having the switches 96a, 96b are serially integrated into the test signal path 36 via a test circuit 62, only schematically illustrated in FIG. 1, arranged in the interconnection module 26 and are connected to one another electrically in series.

During the operation of the safety system shown in FIG. 1, the safety control 10 generates an output signal and/or test signal and transmits this via the output X1 to the forward path of the test signal path 36. This output signal and/or test signal is a dynamic signal, this means a signal changing in time. In the present example, the signal is a binary signal, for example a binary signal based on an electrical voltage which varies between a high voltage level of e.g. 24 V and a low voltage level of e.g. 0 V or ground potential. The output signal can, for example, have test gaps periodically arising at a predefined cycling time and having a predefined duration, wherein the signal respectively has a continuously low signal level during the test gaps and a continuously high signal level between two test gaps following one another.

The safety control 10 is configured to receive an incoming test signal at its safety input I1 and to compare this to an expectation configured in the safety control 10 and in the case of a violation of the expectation to activate a safety related cutoff of the plant monitored by the safety related participants 22. In the present embodiment the safety control 10 expects a substantially unchanged test signal with respect to an output signal transmitted at the output X1 by the safety control and incoming at the safety input I1. In this connection the safety control 10 expects a substantially unchanged test signal with respect to an output signal transmitted at the output X1 by the safety control at the safety input I1. In this connection the safety control 10 can check the incoming signal, e.g. with respect to a synchronicity with the output signal, in particular to the synchronous presence of test gaps having the expected duration in the transmitted signal.

The switches 96a, 96b of the protective devices 24 are closed in the secure state of the protective devices 24 and in the error-free state of the safety system. The test circuit 62 of each safety related participant 22 is adapted to receive the incoming test signal in this state and to output an outgoing test signal substantially unchanged with respect to the test signal in such a way that the expectation of the safety control 10 is satisfied. The test circuit 62 is further adapted to interrupt the test signal and/or to output a test signal which leads to a violation of the expectation of the safety control 10 and in this way to an activation of the safety related function when at least one of the switching paths 96a, 96b of the protective device 24 is interrupted. The test circuit 62 is moreover adapted to then also interrupt the test signal and/or to output a test signal which leads to a violation of the expectation of the safety control 10 and in this way to an activation of the safety related function, when a cross circuit is present between the two electrical switching paths this means when the forward line 98a or the return line 100a of the one circuit path has a cross-circuit to the forward line 98b or return line 100b of the other circuit path. In this way, also this case of error leads to an activation of the safety related function in such a way that a tolerance of such a cross-circuit can and an in this way inherent impairment of the safety will be excluded. In order to bring about an activation of its safety related function, the test circuit 62 can, for example, continuously apply a constant signal level at its output, e.g. a continuously high signal level of 24 V or a continuously low signal level of e.g. 0 V. The corresponding lacking dynamics and/or the missing test gaps of the outgoing test signal lead to the activation of a safety related function.

FIG. 2 shows a safety related participant 22 as is shown in FIG. 1 including the details of the test circuit 62 arranged in the interconnection module 26 of the safety related participant 22. The reference numeral 64 in FIG. 2 refers to the connections between the interconnection module 26 and a passage of the protective device formed by a pair of forward lines 98*a*, 98*b* and return lines 100*a*, 100*b* of the interconnection line 30.

The dynamic test signal 80 output at the output X2 of the safety control transmitted via the test signal path 36 is received at the test signal input 106 of the interconnection module 26. As was described in the foregoing it is preferably a voltage-based signal, in particular a binary direct voltage signal having test gaps 82 of a predefined constant duration at periodic intervals, during which the test signal constantly has a low voltage level and between which the test signal continuously has a high voltage level.

The test signal input 106 is connected to the input of the inverter 110 which receives and inverts the incoming test signal and outputs an inverted test signal, preferably a likewise voltage-based test signal, at its output. A diode 124 can likewise be arranged between the test signal input 106 and the input of the inverter 110, as is shown in FIG. 4 and will be described in detail in the following, the diode 124 is polarized in the positive signal flow direction of the test signal and preventing a positive current flow from the safety related participant 22 to the upstream section of the test signal path 36. This diode 124 is, however, not necessarily required. The output of the inverter 110 is connected to the control input of the controlled current source 112 which is configured to convert the direct voltage signal provided by the inverter 110 into a direct current signal in such a manner that a high level of the direct voltage signal provided by the inverter 110 corresponds to a high level of the direct current signal and a low level of the direct voltage signal provided by the inverter 110 corresponds to a low level of the direct current signal. The controlled current source 112 is configured as an active current source and is adapted to actively generate a positive outgoing electric current flow with respect to the technical current flow direction which, as previously described, depends on the applied control signal. As is shown in FIG. 4 a diode 124 can be arranged between the output of the controlled current source 112 and the forward line 98*a* which is polarized in the direction of the outgoing current of the current source 112 which prevents a current flow from entering into the current source 112.

The current signal generated by the controlled current source 112 is transmitted to a current flow element 114 of the test circuit 62 via the first electrical switching path, this means via the forward line 98*a*, the switch 96*a*, which is closed in the secure state of the protective device 24 and via the return line 100*a*. The current flow element 114 is configured to receive a current signal transmitted via the return line 100*a* at its input and to output a direct voltage signal at its output in such a way that a high current level of the incoming current signal corresponds to a high voltage level of the outgoing voltage signal and a low current level of the incoming current signal corresponds to a low voltage level of the outgoing voltage signal.

The voltage signal generated by the current flow element 114 is transmitted to a second inverter 116 which receives and inverts the signal and outputs an inverted signal at its output, wherein, during the inversion, a high signal level and/or voltage level of the incoming signal is converted into a low signal level and/or voltage level of the outgoing signal and a low signal level and/or voltage level of the incoming signal is converted into a high signal level and/or voltage level of the outgoing signal.

The output of the inverter 116 is connected to the control input of the controlled current sink 118 which is configured to convert the direct voltage signal provided by the inverter 116 into a direct current signal in such a way that a high level of the direct voltage signal provided by the inverter 116 corresponds to a high level of the direct current signal and that a low level of the direct voltage signal provided by the inverter 116 corresponds to a low level of the direct voltage signal. The controlled current sink 118 is configured as an active current sink and is adapted to generate an electric current flow at its output which is a positive incoming electric current flow, this means a negative outgoing current flow with respect to the technical flow direction which depends on the applied control signal in the previously described manner.

The direct current signal generated by the controlled current sink 118 is transmitted to the current direction element 120 via the second electrical switching path, this means via the forward line 98*b*, the switch 96*b*, which is closed in the secure state of the protective device 24 and via the return line 100*b*. As becomes obvious at this point, the designation of the lines 98*b*, 100*b* as "forward" line and/or "return" line is not related to the technical current flow direction, but rather to the signal flow direction which in the case of the switch 96*b* is opposite to the technical current flow direction, since the current sink 118 generates and transmits a current signal defined by an incoming current.

The current direction element 120 is configured to output a direct voltage signal at its output which is dependent on the received direct current signal. The current direction element 120 generates a voltage signal corresponding to the received current signal, as long as the value of the current signal transmitted via the second switching path received by the current direction element 120 and defined by an outgoing current of the current direction element 120 changes between an expected low level of, e.g. 0 mA, and an expected high level of, e.g. 10 mA. In this case the current direction element 120 preferably generates a direct voltage signal at its output which corresponds to the current signal received at its input, this means that a high outgoing current level of the current signal corresponds to a high voltage level of the voltage signal and a low outgoing current level of the current signal corresponds to a low level of the voltage signal.

The current direction element 120 is further adapted to recognize when—in contrast to the expectation for an error-free operation—an incoming current flow is present at the current direction element 120 and/or to recognize when an outgoing current flow is indeed present at the current direction element 120 whose level, however, does not correspond to an expected level during an error-free operation of the safety related participant 22 at least for a certain period of time, this means that in the present case neither the high level expected for an error-free operation nor the low level expected for an error-free operation of the current signal transmitted via the second electrical switching path. For example, an error can be assumed when the value of the outgoing current at the current direction element 120 lies beneath the expected high level of the current signal of the current sink 118 and above the expected low level of the current signal from the current sink 118. In the aforementioned cases the current direction element 120 preferably generates a voltage signal at its output which leads to a violation of the expectation of the safety control, possibly in cooperation with the dynamic unit 122 explained in the following. The current direction element 120, for example, generates a voltage signal having a level which continuously and/or at least for a complete test cycle duration, this means the duration from the start of a test gap up to the expected beginning of the next test gap of the test signal expected by the safety control, takes on a substantially constant value.

The current direction element 120 can comprise a Zener diode 121, as is shown in FIG. 4, which is polarized in the direction of the current outflowing from the current direction element 120, with the Zener diode 121, however, not necessarily being required. This Zener diode 121 can be present in its pass band for an expected high level of the current flowing out of the current direction element 120, during which current flow a voltage is applied at the Zener diode 121 which lies in the region of a pass band voltage of the Zener diode 121. The Zener diode can be present in a blocking band region for a current flowing out of the current direction element 120 which is reduced with respect to the expected current and the voltage of this current, which is applied to the Zener diode, is reduced with respect to the pass band voltage of the Zener diode 121.

A dynamic unit 122 is finally provided which receives the voltage signal generated by the current direction element 120 at its input and is adapted to forward the received signal in a substantially unchanged manner when the received signal has the expected dynamic. When the received signal does not have the expected dynamic, the dynamic unit outputs a signal having a substantially constant level. In this connection, the dynamic unit images both a constant high level ("High") of its input signal and also a constant low level ("Low") of its input signal with respect to the same level onto its output signal depending on the application "high" or "low".

In the following the functionality of the test circuit 62 will be explained with reference to the FIG. 2 and FIG. 3, wherein FIG. 3 shows the current and voltage signals which are respectively present between the sections of the test signal path 36 arranged between the components of the test circuit 62 for an error-free function of the safety related participants 22 and in the secure state of the protective device 24 in which the two switches 96a, 96b are closed. The test signal 80 is shown at the top of FIG. 3 which is based on the electric voltage U input at the test signal input 106 as it is output by the safety control 10 at the output X1. The inverter 110 generates a voltage signal $U_{110}$ inverted with respect to the received test signal 80, this means a voltage signal $U_{110}$ having a low voltage level during the high signal level of the incoming test signal 80 and a high voltage level in the shape of a test pulse during the test gap 82 of the received test signal 80 as is shown in FIG. 3. The controlled current source 112 generates a current signal $I_{112}$ formed by a current $i_{out}$ outgoing from the current source 112 therefrom having a substantially identical shape with respect to the voltage signal $U_{110}$, this means a current pulse having a high outgoing current level during the test gap 82 of the received test signal 80 and a low current level between two current pulses.

This current signal $I_{112}$ is transmitted to the current flow element 114 which generates a voltage signal $U_{114}$ from the transmitted current signal $I_{112}$ which is identical in its shape with respect to the voltage signal $U_{110}$ generated by the inverter 110. The voltage signal $U_{114}$ generated by the current flow element 114 is inverted by the inverter 116 in such a way that this makes available a voltage signal $U_{116}$ at its output and transmits this to the controlled current sink 118 which signal is identical in its shape with respect to the test signal 80 received at the test signal input 106. From this the current sink 118 generates a current signal $I_{118}$ formed by an incoming electric current $i_{in}$ of the current sink 118 which is identical in its shape with respect to the voltage signal $U_{116}$ provided by the inverter 116 and which is transmitted to the current direction element 120 via the switch 96b which current direction element generates a voltage signal $U_{120}$ therefrom which is identical in its shape with respect to the current signal $I_{118}$ provided by the current sink 118 and consequently is identical with respect to the test signal 80 incoming at the test signal input 106. The dynamic unit 122 forwards the signal $U_{120}$ substantially unchanged when the signal $U_{120}$ has the expected dynamic. Otherwise the dynamic unit 122 outputs a signal having a substantially constant level. The output signal of the dynamic unit 122 is made available at the test signal output 108 of the safety related participant 22.

Thus, a test signal is made available at the test signal output 108 for an error-free safety related element 22 and in the secure state of the protective device 24 which test signal is identical with respect to the test signal received at the test signal input 106 with respect to the properties to be checked by the safety control 10, in particular the signal shape and the signal synchronization in such a way that the expectation of the safety control is satisfied.

If at least one of the switches 96a, 96b of the protective device 24 is opened on the occurrence of a non-secure state of the protective device 24, then the current flow element 114 and/or the current direction element 116 is/are no longer excited by the incoming test signal 80 which leads to a loss of the dynamic of the test signal output at the output 108 and thus reliably leads to a safety related cutoff by the safety control. The same effect is brought about by a line interruption of a forward line 98a, 98b or of a return line 100a, 100b in the interconnection line 30 in such a way that also in this case of error a reliable safety related cutoff takes place. In the case of an interruption of the forward line 98a or of the return line 100a a constant high level is present at the output of the inverter 116 such that a permanent control of the current sink 118 takes place and thus a constant incoming current flow is present at the output of the current sink 118 without the expected signal dynamics. In the case of an interruption of the forward line 98b or of the return line 100b no constant output current is generated at the current direction element 120 such that its output signal $U_{120}$ takes on a constant low level without the expected signal dynamics.

Moreover, the test circuit 62 also has the effect that a cross-circuit between the two switching paths is recognized, this means a cross-circuit between the forward line 98a and/or the return line 100a of one electrical circuit paths with the forward line 98b and/or the return line 100b of the other electrical circuit path and leads to a safety related cutoff. In the case of such a cross-circuit the second switching path is directly connected to the current source 112, which in the case of a signal having a high level at its control input drives an outgoing current flow. The current source 112 thus counteracts an outgoing current flow at the current direction element 120 in such a way that an incoming current flow is at least partly intermittently set at the current direction element 120 or at least a current flow having a level present at least for a certain period of time which is different from an expected level of the current signal $I_{118}$ expected on an error-free operation and which, for example, lies beneath the expected high level and simultaneously above the expected low level of e.g. 0 mA. The current direction element 120 is configured to recognize such a deviation from the error-free operation on the basis of the current flow through the current direction element 120 and to generate a voltage signal $U_{120}$ at its output in this case, which output signal preferably has a continuously constant voltage level and which leads to a test signal violating the expectation of the safety control 10 at the test signal output 108. Thus, also this case of error can be reliably recognized and can thus not lead to a loss of the safety related function, the case of error being due to the parallel guidance of the forward lines 98a, 98b and the return lines 100a, 100b of both electrical switching paths in a common interconnection cable 28.

In this respect the test circuit 62 is excited purely by the test signal received at the input 106 and the dynamic of the test signal output at the output 108 is purely generated by the dynamic of this incoming test signal. The test circuit 62 thus completely does without an own time base and, in particular without an own clock generator and the herein described components of the test circuit 62 can all be formed by discrete components, this means that one can do without the use of an integrated circuit, such as, e.g. a microprocessor. The reliability and error safety of the test circuit 62 is considerably increased thereby. Moreover, a delay between the test signal incoming at the test signal input 106 and the test signal outgoing at the test signal output 108 is as far as possible avoided and the reaction time of the safety system is optimized totally.

In the previously described embodiment of a test circuit 62 the inverter 110 and the non-inverting controlled current source 112 together form an inverting controlled current source and the inverter 116 and the non-inverting controlled current sink 118 together form an inverting controlled current sink. Instead of this assembly of the controlled inverting current source and/or current sink from separate components, namely from the inverter 110, 116 and the controlled non-inverting current source 112 and/or current sink 118, also a respective one part controlled inverting current source and/or current sink can be used, this means a controlled current source and/or a current sink which for a high level of the control signal, generate an outgoing and/or an incoming current having a low level and for a low level of the control signal generate an outgoing and/or an incoming current having a high level. Likewise one can in principle do without the current flow element 114 and/or its function which can be integrated into the inverter 116 or into an inverting controlled current sink in that a current controlled inverter and/or a current controlled inverting current sink is used.

The functionality of the previously described test circuit 62 enhancing the safety can also be achieved when the current source 112 and the current sink 118 are exchanged with respect to the described embodiment. An incoming current flow which is generated by a current source 112 is then expected at the current direction element 120 for an error-free operation, in such a way that the current direction element 120 is preferably configured to recognize an error from the fact that—in an unexpected manner—an outgoing current flow is present at the current direction element or an incoming current flow is present which has a level which is not expected for an error-free operation. The diode 124 connected to the forward line 98a is in this case to be correspondingly attached to the current sink 118 with an opposite polarization with respect to the incoming current direction.

FIG. 4 shows a safety related participant 22 which corresponds to the safety related participant 22 shown in FIG. 3, wherein an evaluation unit 50 having a microprocessor 52 and an interruption switch 66 arranged in the test signal path 36 between the dynamic unit 122 and the test signal 108 is additionally shown.

The evaluation unit 50 is connected to the test circuit 62 and to the electrical switching paths formed by the switches 96a, 96b and the forward and return lines 98a, 98b, 100a, 100b via a plurality of switching paths 54 in such a way that the evaluation unit 50 can monitor the switching state of each of the two electrical switching paths via the signal path 54. The evaluation unit 50 is adapted to continuously check whether the two electrical switching paths are interrupted together and to open the interruption switch 66 when the two switching paths are not interrupted together. In this connection the evaluation unit 50 is connected to the interruption switch 66 via a further signal path 54 in order to control this and to thereby open or close this. In this connection the evaluation unit 50 checks whether the two electrical switching paths are interrupted together possibly apart from a predefined tolerance in time. In order to determine the simultaneousness the evaluation unit 50 has an own time base which can, for example, be formed by a clock generator of the microprocessor 52.

The safety of the complete system is increased by the evaluation unit 50 also when the test signal path 36 is in any way already interrupted on an opening of at least one of the switches 96a, 96b and the safety related function is activated. For example, the evaluation unit 50 opens the bridging switch 66 after the recognition of the non-common interruption of both switching paths, preferably permanently opens the bridging switch, also then when the protective device 24 returns into the secure state with closed protective channels until the error is acknowledged, for example, by a user input and/or the functionality of the safety related participant 22 is produced again. Up until then a reactivation of the safety system is prevented in such a way that a tolerance of the present error is excluded.

A signal amplifier or signal driver 125 is further shown in FIG. 4 which is arranged between the interruption switch 66 and the test signal output 108 and outputs the outgoing test signal of the safety related participant 22 in a signal driving manner to the subsequent section of the test signal path 36.

FIG. 5 shows a safety system in accordance with a further embodiment of the invention which, apart from the differences discussed in the following, substantially corresponds to the embodiment shown in FIG. 1 and has a plurality of safety related participants 22. The safety related participants 22 shown in FIG. 5 can all be configured as described in the foregoing with respect to FIGS. 1 to 4; however, also one or more of such safety related participants 22 can be combined with arbitrary different safety related participants 22. In this connection the upper part of the combined illustration of FIG. 5 is a schematic view and the lower part of the combined illustration of FIG. 5 is a substantially photographic view of the same safety system. Elements corresponding to one another in the two illustrations bear the same reference numerals.

The safety system comprises a safety control 10 which is arranged in a switching cabinet 11 and a main module 12 and an input/output module 14 which are connected to one another via a non-illustrated bus bar, wherein the input/ output module 14 has an input X1, a safety input I1, as well as a non-secure standard input I2. A current supply unit 16 for the current supply of the safety system is further arranged in the switching cabinet 11 which is configured as a switching power supply which makes available a constant voltage having a high level of, for example 24 V with respect to ground and a ground potential and/or a constant voltage having a low level of e.g. 0 V, wherein the voltage having the high level provided at a connection A1 of the main module 12 and the voltage having the low level is provided at a connection A2 of the main module 12.

The safety system comprises a bus line 18 having a plurality of bus cables 20, wherein one of the bus cables 20 is connected to the safety control 10. The safety system further comprises a plurality of safety related participants 22 which are connected to one another behind one another in a line via the bus cable 20 and are connected to the safety control 10 via the bus line 18. A termination element 32 is present at the end of the line formed by the safety related participants 22 which in this example is directly connected to the last safety related participant 22 of the line, this means without a cable being switched therebetween. In principle, the termination element 32 could also be connected to the bus line 18 via a further bus cable.

The protective device 24, the interconnection modules 26 and the termination element 32 respectively have an own housing which is preferably configured in accordance with the housing protective type IP 67 or IP 20 or a different housing protective type protecting against contamination or humidity.

The bus line 18 and the safety related participants 22 connected to the bus line 18 form a test signal path 36 having a forward path 38 connected to the output X1 of the safety control 10 and having a return path 40 connected to the safety input I1 of the safety control 10, wherein the forward path 38 and the return path 40 are connected to one another via the termination element 32 and both the forward path 38 and the return path 40 run through the safety related participants 22. Furthermore, the safety related participants 22, the bus line 18 and the termination element 32 form a data path 42 which has a data forward path formed by the forward path 38 of the test signal path, this means this is identical to the data forward path and has a separate data return path 44 connected to the input I2 of the safety control 10 which together form a ring bus line. The data path 42 serves for the transmission of data between the safety control 10 and the safety related participants 22 and possibly the termination element 32 in addition to the safety information transmitted via the test signal path 36. Furthermore, a first current supply line 46 guided via the connection A1 of the main module and a second current supply line 48 guided via the connection A2 of the main module are provided via which the safety control 10, the safety related participants 22 and the termination element 32 can be supplied with current. As is shown in FIG. 5 at the example of the right hand safety related participant 22 by means of a reference numeral the interconnection cables 30 can respectively comprise a first and a second current supply conductor 46', 48' via which the respective protective device 24 can be connected to the first and the second current supply line 46, 48 and thereby be supplied with a current.

As is shown in FIG. 5 the test signal path 36, the data path 42, the first current supply line 46 and the second current supply line 48 are arranged in the common bus line 18 and are all guided in the same common bus cable 20 of the bus line 18. In this connection, the bus cables 20 each have an electrically conductive conductor for the forward path 38 of the test signal path 36 which simultaneously represents the data forward path for the data return path 44, for the first current supply line 46 and for the second current supply line 48 so that the complete cabling of the safety related participants 22 to the safety controller 10 is realized by a line-shaped bus line 18 composed of bus cables 20 each having at least five conductors. Thus, precisely only one bus cable 20 is required in order to connect two adjacent safety related participants 22 to one another and/or to the safety control 10.

An output signal is generated by the safety control 10 and is transmitted via the output X1 to the forward path 38. This output signal is looped through directly and without the possibility of interruption substantially unchanged in the interconnection modules 26 of the safety related participants 22, as is visible in FIG. 5, and is transmitted to the termination element 32. At the same time a respective evaluation unit 50 having a microprocessor 52 is provided in the interconnection modules 26. The evaluation unit 50 having a microprocessor 52 which carries out the herein described discrepancy check and controls the interruption switch 66, in this embodiment also satisfies further functions and in this connection can also be referred to as a logic unit. The evaluation unit 50 is connected to the forward path 38 via a signal path 54 and is adapted to monitor the output signal transmitted via the forward path 38, for example, for the purpose of a synchronization.

The output signal generated by the safety control and transmitted via the forward path 38 is based on an electrical voltage and has synchronization features periodically arising at a predefined cycling time and has data features arranged between the synchronization features which data features respectively represent a data bit of the output data transmitted by the safety control 10.

The termination element 32 is adapted to receive the output signal from the forward path 38 and to output a test signal to the return path 40 of the test signal path in dependence on the output signal received by the forward path 38, said test signal being changed with respect to the received output signal. The test signal transmitted via the return path 40 thus differs from the output signal transmitted by the safety control 10. For this purpose, the termination element 32 likewise has a logic unit 56 having a microprocessor 58 connected to the forward path 38 which receives and evaluates the output signal transmitted via the forward path 38. The logic unit 56 is connected to the test signal generator 60 of the determination element 32 and controls this in order to actively generate a test signal and to output this to the test signal path 36 connected to the return path 40 of the test signal path 36 connected to the test signal generator 60 in a signal driving manner.

The return path 40 of the test signal path 36 runs through the safety related participants 22. These are adapted to interrupt the return path 40 on the presence and/or occurrence of a non-secure state of their respective protective device. The interconnection modules 26 respectively have a test circuit 62 configured, e.g. as described in the foregoing, which, as described, is connected to the generally two protective channels of the respective protective device 24 via connections 64 of the interconnection line 30, wherein the test circuit 62 in cooperation with the protective channels of the protective device 24 brings about an activation of the safety related function on the presence of a non-secure state of the protective device 24.

The logic units 56, 50 of the termination element 32 and the interconnection modules 26 are respectively arranged in the data path 42 and/or the data return path 44 and are adapted to receive data via the data path 42 and to transmit the data to the data return path 44. The data generated by the safety related participants 22 and transmitted via the data return path 44 preferably comprises diagnostic information and/or status information generated by the respective safety related participant 22. This information can, in particular reproduce the safety-relevant switching state of the respective protective device 24 which is also crucial for the interruption of the test signal path, this means the state "secure" or "non-secure" taken on by the protective device 24. The safety control 10 is thereby in a position to determine which safety related participant 22 caused the cutoff, in the case that a safety related cutoff was triggered. The data transmitted to the safety control can also identify an occurring discrepancy error and preferably the erroneous safety related participant 22.

The interconnection modules 26 respectively have an input/output interface 68, in particular a binary input/output interface 68 which is respectively connected to the logic unit 50 via a signal path 54 which interface is connected to an input/output interface 68 of the protective device, in particular a binary and/or non-secure input/output interface 68 of the protective device 24, via at least one signal conductor 70 provided in the interconnection line 30 in order to transmit data received via the data return path 44 to the protective device 24 and/or in order to transmit output data generated by the protective device 24 to the safety control 10 via the data return path 44.

The safety control 10 is adapted to receive the signal transmitted via the return path 40 of the test signal path 36 and to compare this to an expectation configured in the safety control 10. Since the test signal transmitted during the operation of the safety system via the return path 40 is different from the output signal transmitted via the forward path 38 and only the test signal corresponds to the expectation of the safety control 10, e.g. a cross-circuit between the forward path 38 and the return path 40 of the test signal path 36 leads to an absence of the expected signal at the safety input I1. Such a functional error, such as can, for example, arise on a squashing of a bus cable 20 thus reliably leads to a violation of the expectation of the safety control and to a safety related cutoff in such a way that a tolerance of such an error state is excluded by the safety control 10.

The forward path 38 of the test signal path 36 forms a ring-shaped data path 42 together with the data return path 44, said data path 42 being configured as a ring bus via which the safety control 10, the termination element 32 and the safety related participants 22 communicate with one another and indeed following a kind of subsequently described daisy-chain bus communication, in particular in accordance with the master-slave principle. The safety control 10, the termination element 32 and the safety related participants 22 in this connection form the participants of the bus communication, wherein the safety control 10 at the same time represents the bus master.

In order to receive data from the data path 42 and to transmit data via the data path 42 each participant 22, 32 is configured to receive an incoming data signal transmitted via the data path 42 at an input, to process the received data and to preferably simultaneously transmit an output data signal to the data path 42 at an output different from the input in such a way that the participants 22, 32 form a message chain along which the data can be transmitted from one participant 22, 32 to the next in a predefined data flow direction. The logic units 50, 56 of the safety related participants 22 and the termination element 32 in this connection serve as a transmission and reception circuit via which the respective participants 22, 32 receive and send data.

LIST OF REFERENCE NUMERALS 10 safety control
11 switching cabinet
12 main module
14 input/output module
16 current supply unit
18 bus line
20 bus cable
22 safety related participant
24 protective device
26 interconnection module
28 interconnection cable
30 interconnection line
32 termination element
34 plug connector
36 test signal path
38 forward path, data forward path
40 return path of the test signal path
42 data path
44 data return path
46 first current supply line
46' first current supply conductor
48 second current supply line
48' second current supply conductor
50 evaluation unit, logic unit
52 microprocessor
54 signal path
56 logic unit
58 microprocessor
60 test signal generator
62 test circuit
64 connection
66 interruption switch
68 input/output interface
70 signal conductor
80 test signal
82 test gap
96a, 96b switch
98a, 98b forward line
100a, 100b return line
106 test signal input
108 test signal output
110 inverter
112 controlled current source
114 current flow element
116 inverter
118 controlled current sink
120 current direction element
121 Zener diode
122 dynamic unit
124 diode
125 signal amplifier
A1 direct voltage connection
A2 ground connection
$i_{in}$ incoming electrical current
$i_{out}$ outgoing electrical current
$I_{112}, I_{118}$ current signal
I1 safety input
I2 input
U electrical voltage
80, $U_{110}, U_{114}$ voltage signal
$U_{116}, U_{120}$ voltage signal
X1 output

The invention claimed is:

1. A safety system comprising
a safety unit (10) having an output (X1) and a safety input (I1);
a bus line (18) arranged between the output (X1) and the safety input (I1) of the safety unit (10);
at least one safety related participant (22) connected to the bus line (18);
  wherein the bus line (18) and the safety related participant (22) form a test signal path (36) having a forward path (38) connected to the output (X1) of the safety unit (10) and a return path (40) connected to the safety input (I1) of the safety unit (10);
  wherein the safety related participant (22) comprises an interconnection module (26) connected to the bus line (18), said interconnection module comprising a test signal input (106) for an incoming test signal (80), a test signal output (108) for an outgoing test signal and a protective device (24) connected to the interconnection module (26) via an interconnection line (30) and integrated in the test signal path (36) by means of the interconnection module (26);
  wherein the protective device (24) comprises two switches (96a, 96b) which are respectively connected to the interconnection module (26) via a forward line (98a, 98b) and a return line (100a, 100b) of the interconnection line (30) for the formation of a first and a second electric switching path and which are integrated in the test signal path (36);
  wherein the interconnection module (26) comprises a test circuit (62) for the two switching paths which comprises at least a controlled current source (112), a controlled current sink (118) and a current direction element (120);
  wherein the test signal input (106) of the interconnection module (26) is connected to a control input of the controlled current source (112) or the controlled current sink (118) in such a way that the controlled current source (112) or current sink (118) can be controlled by the incoming test signal (80) or by a signal ($U_{110}$) derived therefrom and wherein a controlled output of the same one of the current source (112) and the current sink (118) is connected to the forward line (98a) of the first switching path in order to transmit a current via the first switching path;
  wherein the return line (100a) of the first switching path is connected to the control input of the respective other one of the controlled current source (112) and the controlled current sink (118) in such a way that the controlled current source (112) or current sink (118) can be controlled by a current signal ($I_{112}$) transmitted via the first switching path or a signal ($U_{116}$) derived therefrom;
  wherein a controlled output of the other one of the controlled current source (112) and current sink (118) is connected to the forward line (98b) of the second switching path in order to transmit a current via the second switching path;
  wherein the return line (100b) of the second switching path is connected to the current direction element (120) which is configured to provide a signal ($U_{120}$) which is dependent on the current transmitted via the second switching path; and
  wherein the test signal output (108) of the interconnection module (26) is connected to the current direction element (120) in order to output the signal ($U_{120}$) generated by the current direction element or a signal derived therefrom as an outgoing test signal of the safety related participant (22).

2. The safety system in accordance with claim 1, wherein the safety unit (10) is a safety control.

3. The safety system in accordance with claim 1, wherein the safety system is adapted to generate a dynamic test signal (80) and to transmit the test signal to the test signal input (106) of the safety related participant (22) via the test signal path (36) which test signal is configured as a binary direct current or direct voltage signal which alternates between a predefined high and a predefined low current level or voltage level.

4. The safety system in accordance with claim 1, wherein the current direction element (120) is adapted to recognize when a current flow is present at the current direction element (120), the current flow having a direction which is opposite to the direction expected on an error-free operation of the safety related participant (22).

5. The safety system in accordance with claim 4, wherein the current direction element (120) is further adapted to output a signal when a current flow is present at the current direction element (120) the direction of which is opposite to the direction expected on an error-free operation of the safety related participant (22), said signal leading to an activation of a safety function of the safety unit (10).

6. The safety system in accordance with claim 1, wherein current direction element (120) is adapted to recognize when a current flow is present at the current direction element (120) whose value differs at least for a certain period of time from the current level expected during an error-free operation.

7. The safety system in accordance with claim 1, wherein the current direction element (120) is further adapted to output a signal when a current flow is present at the current direction element (120) whose value differs at least for a certain period of time from the current level expected during an error-free operation, said signal leading to the activation of a safety function of the safety unit (10).

8. The safety system in accordance with claim 1, wherein the current direction element (120) is adapted to output a signal having a continuously substantially constant level on the recognition of a non error-free operation.

9. The safety system in accordance with claim 1, wherein the test circuit (62) is adapted to carry out a signal inversion between the return line (100a) of the first switching path and the control input of the controlled current source (112) or current sink (118) connected to the forward line (98b) of the second switching path such that a high level of the current signal ($I_{112}$) transmitted via the first switching path corresponds to a low level of the current signal ($I_{118}$) transmitted via the second switching path and such that a low level of the current signal ($I_{112}$) transmitted via the first switching path corresponds to a high level of the current signal ($I_{118}$) transmitted via the second switching path.

10. The safety system in accordance with claim 1, wherein the test circuit (62) is adapted to carry out a signal inversion between the test signal input (106) and the control input of the current source (112) or current sink (118) connected to the test signal input; and/or
  wherein the test circuit (62) is adapted to carry out a signal inversion between the current direction element (120) and the test signal output (108).

11. The safety system in accordance with claim 1, wherein a current flow element (114) of the test circuit (62) is arranged between the return line (98b) of the first switching path and the control input of the current source (112) or current sink (118) connected to the forward line (100b) of the second switching path, which test circuit (62) is configured to receive the current signal ($I_{112}$) transmitted via the first switching path at its input and to output a direct voltage signal ($U_{114}$) which is dependent on the received current signal ($I_{112}$) at its output.

12. The safety system in accordance with claim 1, wherein a dynamic unit (122) of the test circuit (62) is arranged between the current direction element (120) and the test signal output (108) which dynamic unit is adapted to receive the signal ($U_{120}$) output by the current direction element (120) or a signal derived therefrom at its input and to output a signal whose shape depends on whether the received signal ($U_{120}$) has an expected dynamic.

13. The safety system in accordance with claim 1, wherein the test circuit (62) of the interconnection module (26) is assembled from discrete components.

14. The safety system in accordance with claim 1, wherein the test circuit (62) is configured in such a way that the dynamic of the signals ($U_{110}$, $I_{112}$, $U_{114}$, $U_{116}$, $I_{118}$, $U_{120}$) generated by the test circuit (62) is generated purely by the dynamic of the incoming test signal (80).

15. The safety system in accordance with claim 14, wherein the test circuit (62) of the interconnection module (26) has no time base independent of the incoming test signal (80).

16. The safety system in accordance with claim 1, wherein the protective device (24) is configured to open the two switches (96a, 96b) together on the occurrence of a non-secure state of the protective device (24) and thereby to interrupt the associated electric switching path, wherein
the safety related participant (22) comprises an interruption switch (66) arranged in the test signal path (36) and an evaluation unit (50) which is connected to the first and the second switching path and which is adapted to check whether the first and the second switching path are interrupted together and to open the interruption switch (66) when the two switching paths are not interrupted together.

17. The safety system in accordance with claim 1, wherein the safety system comprises at least one further safety related participant (22) connected to the bus line (18) and comprising a protective device (24), which safety related participant is adapted in such a way that the presence of a non-secure state of its protective device (24) brings about an interruption of the test signal path (36);
wherein the safety related participants (22) are arranged along the bus line (18) in a line in such a way that both the forward path (38) and also the return path (40) of the test signal path (36) run through the same safety related participants (22);
wherein the safety system comprises a termination element (32) connected at the end of the line and connecting the forward path (38) and the return path (40) of the test signal path (36);
wherein the safety unit (10) is configured to transmit an output signal at its output (X1) connected to the forward path (38); and
wherein the termination element (32) is configured to receive the output signal from the forward path (38) and to output a test signal to the return path (40) of the test signal path (36) in dependence on the output signal received from the forward path (38), said test signal being changed with respect to the received output signal.

18. An interconnection module (26) for including a protective device (24) in a safety system comprising
a safety unit (10) having an output (X1) and a safety input (I1);
a bus line (18) arranged between the output (X1) and the safety input (I1) of the safety unit (10);
at least one safety related participant (22) connected to the bus line (18);
wherein the bus line (18) and the safety related participant (22) form a test signal path (36) having a forward path (38) connected to the output (X1) of the safety unit (10) and a return path (40) connected to the safety input (I1) of the safety unit (10);
wherein the safety related participant (22) comprises a protective device (24) connected to an interconnection module (26) via an interconnection line (30) and the protective device is integrated in the test signal path (36) by means of the interconnection module (26);
wherein the protective device (24) comprises two switches (96a, 96b) which are respectively connected to the interconnection module (26) via a forward line (98a, 98b) and a return line (100a, 100b) of the interconnection line (30) for the formation of a first and a second electric switching path and which are integrated in the test signal path (36);
said interconnection module comprising
at least one test signal path (36) which is arranged between a test signal input (106) for an incoming test signal (80) and a test signal output (108) for an outgoing test signal of the interconnection module (26);
a first and a second pair of a respective signal input and a respective signal output, wherein the signal input and the signal output of a pair are respectively configured for the integration of an electric switching path into the test signal path (36);
a test circuit (62) for the two switching paths which comprises a controlled current source (112), a controlled current sink (118), a current flow element (114) and a current direction element (120);
wherein the test signal input (80) of the interconnection module (26) is connected to a control input of the controlled current source (112) or of the controlled current sink (118) in such a way that the controlled current source (112) or current sink (118) can be controlled by the incoming test signal (80) or by a signal ($U_{110}$) derived therefrom and wherein a controlled output of the same of the current source (112) and the current sink (118) is connected to the signal output of the first pair of signal output and signal input in order to transmit a current via the first switching path;
wherein the signal input of the first pair of signal input and signal output is connected to the control input of the respective other one of the controlled current source (112) and the controlled current sink (118) in such a way that the controlled current source (112) or current sink (118) can be controlled through the current signal ($I_{112}$) transmitted via the first switching path or a signal ($U_{116}$) derived therefrom;
wherein a controlled output of the other one of the controlled current source (112) and current sink (118) is connected to the signal output of the second pair of signal input and signal output in order to transmit a current via the second switching path;
wherein the signal input of the second pair of signal input and signal output is connected to the current direction element (120) which is configured to provide a signal ($U_{120}$) in dependence on the current transmitted via the second switching path; and wherein the test signal output (108) of the interconnection module (26) is connected to the current direction element (120*s*) in order to output the signal ($U_{120}$) generated by the current direction element or a signal derived therefrom as an outgoing test signal of the safety related participant (22).

* * * * *